US008606193B2

(12) United States Patent
Ko et al.

(10) Patent No.: US 8,606,193 B2
(45) Date of Patent: Dec. 10, 2013

(54) RF TRANSCEIVER IC HAVING INTERNAL LOOPBACK CONDUCTOR FOR IP2 SELF TEST

(75) Inventors: Jin-Su Ko, San Jose, CA (US); Michael Kohlmann, San Francisco, CA (US); Bahman Ahrari, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1227 days.

(21) Appl. No.: 12/270,755

(22) Filed: Nov. 13, 2008

(65) Prior Publication Data

US 2010/0120369 A1 May 13, 2010

(51) Int. Cl.
*H04B 1/38* (2006.01)

(52) U.S. Cl.
USPC ............ 455/73; 455/39; 455/150.1; 455/266; 455/193.2; 330/306; 375/295; 375/350; 375/344; 375/346; 725/68; 257/728; 348/731; 348/733; 348/726

(58) Field of Classification Search
USPC ........ 455/39, 150.1, 73, 266, 193.2; 330/306; 375/295, 350, 344, 346; 725/68; 257/728; 348/731, 733, 726
See application file for complete search history.

(56) References Cited

U.S. PATENT DOCUMENTS

| | | | | |
|---|---|---|---|---|
| 5,819,157 A * | 10/1998 | Ben-Efraim et al. | ............ | 725/68 |
| 5,870,439 A * | 2/1999 | Ben-Efraim et al. | ......... | 375/346 |
| 5,901,184 A * | 5/1999 | Ben-Efraim et al. | ......... | 375/344 |
| 5,955,783 A * | 9/1999 | Ben-Efraim et al. | ......... | 257/728 |
| 5,999,793 A * | 12/1999 | Ben-Efraim et al. | ............ | 725/68 |
| 6,091,931 A * | 7/2000 | Ben-Efraim et al. | ......... | 455/3.02 |
| 6,134,282 A * | 10/2000 | Ben-Efraim et al. | ......... | 375/350 |
| 7,657,241 B2 | 2/2010 | Shah | | |
| 2008/0218273 A1* | 9/2008 | Uehara et al. | ................. | 330/306 |
| 2008/0232268 A1 | 9/2008 | Kahrizi et al. | | |

(Continued)

FOREIGN PATENT DOCUMENTS

| | | |
|---|---|---|
| CN | 1381090 A | 11/2002 |
| CN | 1638369 A | 7/2005 |

(Continued)

OTHER PUBLICATIONS

Dufrene K et al: "Adaptive IP2 calibration scheme for direct-conversion receivers" Radio and Wireless Symposium, 2006 IEEE San Diego, CA, USA 2006, Piscataway, NJ, USA,IEEE, Jan. 1, 2006, pp. 111-114, XP010907064 ISBN: 978-0/7803-9412-4 figure 2.

(Continued)

*Primary Examiner* — April G Gonzales
(74) *Attorney, Agent, or Firm* — Kevin T. Cheatham

(57) ABSTRACT

An RF transceiver integrated circuit has a novel segmented, low parasitic capacitance, internal loopback conductor usable for conducting IP2 self testing and/or calibration. In a first novel aspect, the transmit mixer of the transceiver is a current mode output mixer. The receive mixer is a passive mixer that has a low input impedance. In the loopback mode, the transmit mixer drives a two tone current signal to the passive mixer via the loopback conductor. In a second novel aspect, only one quadrature branch of the transmit mixer is used to generate both tones required for carrying out an IP2 test. In a third novel aspect, a first calibration test is performed using one quadrature branch of the transmit mixer at the same time that a second calibration test is performed using the other quadrature branch, thereby reducing loopback test time and power consumption.

26 Claims, 5 Drawing Sheets

(56) References Cited

U.S. PATENT DOCUMENTS

| | | |
|---|---|---|
| 2009/0111420 A1* | 4/2009 | Tasic et al. .................... 455/334 |
| 2009/0154595 A1* | 6/2009 | Choksi et al. ................. 375/295 |
| 2012/0231729 A1 | 9/2012 | Xu et al. |

FOREIGN PATENT DOCUMENTS

| | | |
|---|---|---|
| CN | 1639992 A | 7/2005 |
| JP | 8288882 | 11/1996 |
| JP | 2004532551 A | 10/2004 |
| JP | 2006135422 A | 5/2006 |
| JP | 2008160483 A | 7/2008 |
| WO | 2007068089 A1 | 6/2007 |

OTHER PUBLICATIONS

International Search Report & Written Opinion—PCT/US2009/064454, International Search Authority—European Patent Office—Mar. 30, 2010.

Darabi, H. et al., "An IP2 Improvement Technique for Zero-IF Down-Converters", IEEE, International Solid-State Circuits Conference 2006, 25.7, Feb. 6-9, 2006.

Vassiliou, I. et al., "A Single-Chip Digitally Calibrated 5.15-5.825-GHz 0.18-um CMOS Transceiver for 802.11a Wireless LAN", IEEE Journal of Solid-State Circuits, vol. 38, No. 12, Dec. 2003.

* cited by examiner

LOOP FEEDBACK IP2 TEST

| | WiFi LOOPBACK (PRIOR ART) | NOVEL LOOPBACK OF FIGURES 1 - 3 |
|---|---|---|
| GAIN (TX IN to RX OUT) | LOW | HIGH |
| MODE | VOLTAGE MODE DRIVEN | CURRENT MODE DRIVEN |
| TX MIXER OUTPUT IMPEDANCE | LOW<br>FIXED L w/DA in | HIGH<br>TUNED TX TANK |
| RECEIVER MIXER INPUT IMPEDANCE | HIGH<br>-j1000 OHMS<br>Cgs | LOW<br>150 OHMS<br>Rmx_on + R_TIA |
| MATCHING | MAY NEED MATCHING | NO MATHCING REQUIRED |

US 8,606,193 B2

RF TRANSCEIVER IC HAVING INTERNAL LOOPBACK CONDUCTOR FOR IP2 SELF TEST

BACKGROUND INFORMATION

1. Technical Field

The disclosed embodiments relate to internal loopback testing and calibration of RF transceivers.

2. Background Information

Both the transmitter and the receiver of a cellular telephone are ideally linear devices that introduce minimal distortion into the signal being communicated. One type of distortion is referred to as second-order distortion. A linear amplifier generally introduces only a small amount of second order distortion when the amplifier is operating at a low output power level. As the output power increases, however, the output power at the fundamental frequency (the frequency of the input signal) rises at a first rate with respect to overall rising output power, whereas the output power due to second-order distortion rises at a faster rate. When the output power of the amplifier is high enough, the output power of the second-order distortion reaches the output power of the fundamental signal. This point of intersection is referred to as the second order intercept point (IP2). The IP2 point of a system, such as a cellular telephone transmit chain or a cellular telephone receive chain, can be used as a measure of the second-order distortion of the system.

One way to measure the IP2 of a system involves using so-called two-tone analysis. A signal of one pure frequency is referred to as a "tone". Two tones of equal strength but different frequencies are put through the system. The system will generate an output at each of the two fundamental frequencies, but will also generate an output at other frequencies due to second-order effects. The outputs due to second-order effects will include, for example, an output that has a frequency equal to the sum of the frequencies of the two input tones. The outputs due to second-order effects will also include, for example, an output that has a frequency equal to the difference of the frequencies of the two input tones. The output powers of the output signals that are not at either of the two fundamental frequencies are measured and used to determine the IP2 of the system.

To enhance the operation of the transceiver within a cellular telephone, it is often desired to measure the IP2 of a transceiver and then to calibrate various parts of the transceiver so as to reduce the IP2 exhibited by the transceiver. External signal sources can be used to generate the signals of the two tones for use in the two-tone analysis described above, but such external sources may only be available in the factory during factory calibration. Although such factory calibration may allow the cellular telephone transceiver to be calibrated to account for variations in the semiconductor fabrication process used to make transceiver integrated circuits, such factory calibration cannot account for performance changes that occur due to temperature changes that occur during operation of the cellular telephone. Similarly, such factory calibration cannot account for performance changes that occur due to voltage supply variations that occur during operation of the cellular telephone transceiver. It is therefore desired to be able to monitor IP2 and to calibrate parts of the transceiver during use of the cellular telephone outside the factory such that distortion can remain minimized as operating conditions change.

Several ways have been proposed for using the transmitter of a transceiver to generate the two tones needed for a two-tone IP2 analysis test so that the IP2 measurements and calibrations can be made outside of the factory in a functioning transceiver. One suggestion is set forth in the paper entitled "An IP2 Improvement Technique for Zero-IF Down-Converters" by Darabi et al. This paper describes a long loop approach whereby an external power amplifier (PA) and low-noise amplifier (LNA) are used to generate one tone blocker with AM modulation in every slot. This approach, however, has several drawbacks.

First, an unnecessarily large amount of power that even may exceed a maximum output power rating of the transceiver can be driven back onto the transceiver's antenna during calibration. Usually the power level of the blocker used in calibration testing is higher than the power level of the blocker specified in standards to detect a nonlinear effect. Second, the one tone blocker approach utilizes an operating external power amplifier that generally consumes more power than is necessary. The resulting increased power consumption can reduce talk time due to the power amplifier being turned on in every slot. Third, the one tone blocker approach is not an efficient way to detect the modulated signal in an OFDMA modem.

A second approach is set forth in the WiFi, IEEE 802.11 arts in a paper entitled "A Single-Chip Digitally Calibrated 5.15-5.825-GHz 0.18-um CMOS Transceiver for 802.11a Wireless LAN," by Bouras et al. The Bouras et al. paper suggests using an on-chip loopback connection to generate one tone for IQ mismatch calibration. If this approach were extended and applied to IP2 calibration of a cellular telephone receiver, several problems would likely occur. First, the loopback circuitry operates in a voltage driven mode. The baseband signal to be detected in the receiver would therefore likely be of an undesirably small amplitude due to the long on-chip conductors that often carry the high frequency RF loopback signals from the transmitter to the receiver. Often the distance between transmitter and receiver within a cellular telephone transceiver integrated circuit is substantial in order to prevent coupling between the receiver and transmitter. This substantial distance means that if the internal loopback connection technique were employed, then the transmitter would have to drive through long conductors to supply the two tones to the receiver circuitry for internal loopback calibration. As a result, the baseband signal as received at the receiver would likely be of such an undesirably small amplitude that calibrating the receiver would be difficult or impossible. Second, the circuits in the loopback path of the WiFi circuit might generate nonlinearities such as intermodulation terms and harmonics. These nonlinearities may interfere with receiver calibration of a cellular telephone transceiver.

SUMMARY

An RF transceiver integrated circuit of a cellular telephone has a loopback conductor circuit usable for conducting IP2 self testing and calibration. The loopback conductor circuit includes a control circuit and a novel segmented, low parasitic capacitance, internal loopback conductor. In one example, a baseband processor integrated circuit can control the control circuit of the loopback conductor circuit in the RF transceiver integrated circuit via a serial bus that extends from the baseband processor integrated circuit to the RF transceiver integrated circuit. The control circuit of the loopback conductor circuit receives control information from the serial bus and in response controls the segmented loopback conductor.

In a first novel aspect, the transmit mixer of the transmit chain of the RF transceiver integrated circuit is a current mode output mixer. The receive mixer of the receive chain of the RF transceiver integrated circuit is a passive mixer that has a relatively low input impedance. Rather than using an active mixer in the receive chain, a passive mixer is used that is followed by a transimpedance amplifier (TIA). The TIA outputs a voltage proportional to its input current received from the passive mixer. In the loopback mode, the transmit mixer drives a two tone current signal to the passive mixer via the segmented loopback conductor. Other portions of the transceiver are controlled to maximize power transfer from the transmit chain to the receive chain during the loopback mode, and to reduce power consumption, and to prevent unwanted RF transmissions from occurring. In a normal operating mode of the RF transceiver integrated circuit, the segments of the loopback conductor are isolated from one another by switch blocks such that parasitic loading and coupling problems that otherwise might occur due to the long segments of the loopback conductor are minimized or avoided.

In a second novel aspect, only one quadrature branch of the transmit mixer is used to generate both tones required for carrying out an IP2 test. Using a single branch reduces power consumption during loopback testing as compared to using two branches in conventional fashion. Using a single branch also facilitates generating two tones that have identical power magnitudes.

In a third novel aspect, a first calibration test is performed using one quadrature branch of the transmit mixer at the same time that a second calibration test is performed using the other quadrature branch. In some situations, performing multiple tests simultaneously reduces loopback test time and reduced loopback test power consumption.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
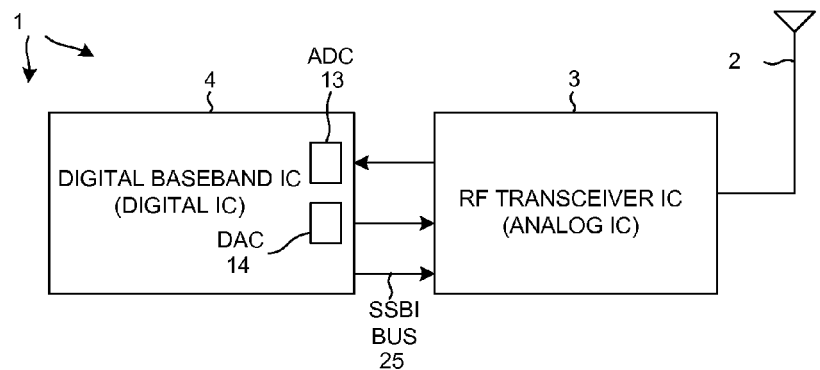
FIG. 1 is a simplified high level block diagram of one particular type of mobile communication device 1 in accordance with one novel aspect.

FIG. 1 is a very simplified high level block diagram of one particular type of mobile communication device 1 in accordance with one novel aspect. In this particular example, mobile communication device 1 is a cellular telephone that uses a Code Division Multiple Access (CDMA) or an Orthogonal Frequency Division Multiple Access (OFDMA) cellular telephone communication protocol. The cellular telephone includes (among several other parts not illustrated) an antenna 2 and two integrated circuits 3 and 4. Integrated circuit 4 is called a "digital baseband integrated circuit" or a "baseband processor integrated circuit". Integrated circuit 3 is an RF transceiver integrated circuit. RF transceiver integrated circuit 3 is called a "transceiver" because it includes a transmitter as well as a receiver.

Figure 2:
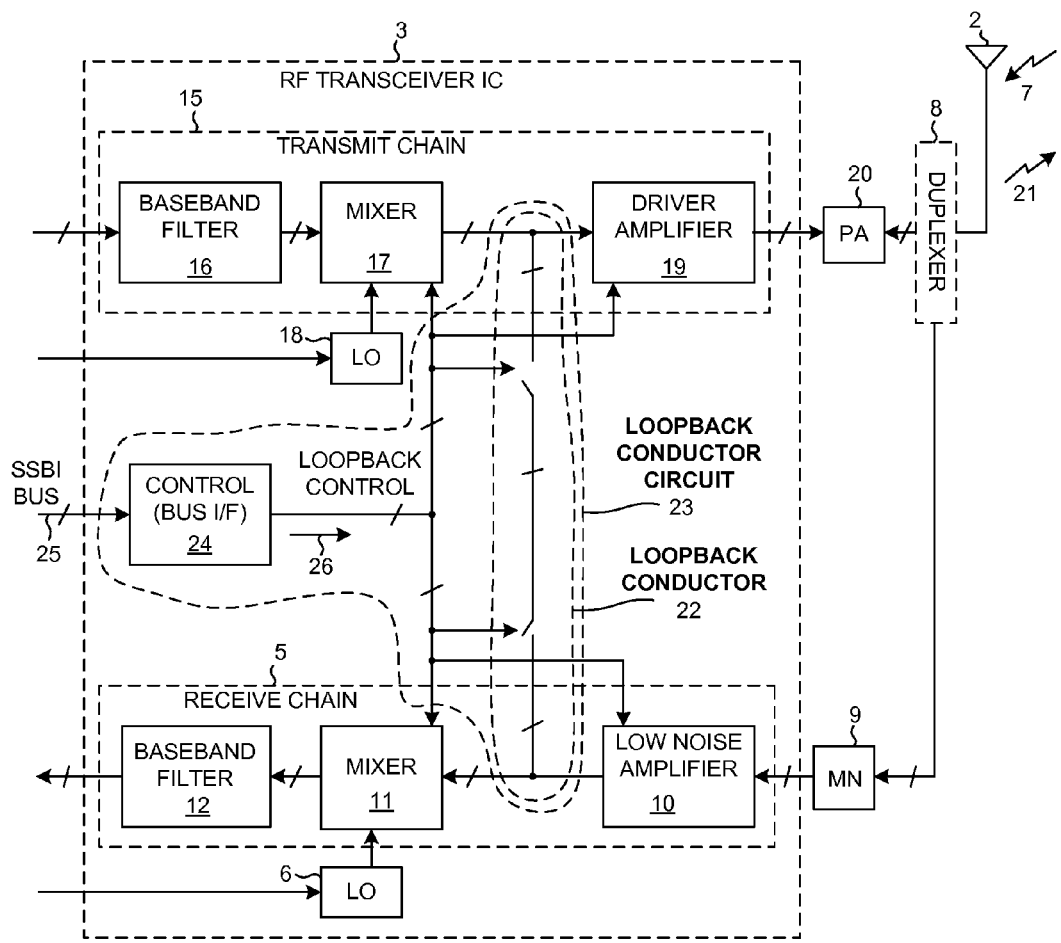
FIG. 2 is a more detailed block diagram of the RF transceiver integrated circuit 3 of FIG. 1.

FIG. 2 is a more detailed block diagram of the RF transceiver integrated circuit 3. The receiver includes what is called a "receive chain" 5 as well as a local oscillator (LO) 6. When the cellular telephone is receiving, a high frequency RF signal 7 is received on antenna 2. Information from signal 7 passes through duplexer 8, matching network 9, and through the receive chain 5. Signal 7 is amplified by low noise amplifier (LNA) 10 and is down-converted in frequency by mixer 11. The resulting down-converted signal is filtered by baseband filter 12 and is passed to the digital baseband integrated circuit 4. An analog-to-digital converter 13 in the digital baseband integrated circuit 4 converts the signal into digital form and the resulting digital information is processed by digital circuitry in the digital baseband integrated circuit 4. The digital baseband integrated circuit 4 tunes the receiver by controlling the frequency of a local oscillator signal (LO) supplied by local oscillator 6 to mixer 11.

If the cellular telephone is transmitting, then information to be transmitted is converted into analog form by a digital-to-analog converter 14 in the digital baseband integrated circuit 4 and is supplied to "transmit chain" 15. Baseband filter 16 filters out noise due to the digital-to-analog conversion process. Mixer block 17 under control of local oscillator 18 then up-converts the signal into a high frequency signal. Driver amplifier 19 and an external power amplifier 20 amplify the high frequency signal to drive antenna 2 so that a high frequency RF signal 21 is transmitted from antenna 2.

In addition to receive chain 5 and transmit chain 15, RF transceiver integrated circuit 3 includes a novel loopback conductor circuit 23. Loopback conductor circuit 23 includes a loopback conductor 22 and a control circuit 24. Control circuit 24 in the example of FIG. 2 includes a bus interface mechanism that interfaces via a SSBI serial bus and conductors 25 with digital baseband integrated circuit 4. Circuitry in the digital baseband integrated circuit 4 uses the SSBI bus to control the loopback conductor 22 by sending appropriate loopback control information across SSMI bus 25 to control circuit 24. Control circuit 24 in turn sends appropriate loopback control signals 26 to loopback conductor 22 so that loopback conductor 22 is controlled to either couple the transmit chain 15 to the receive chain 5 or to decouple the transmit chain 15 from the receive chain 5.

Figure 3:
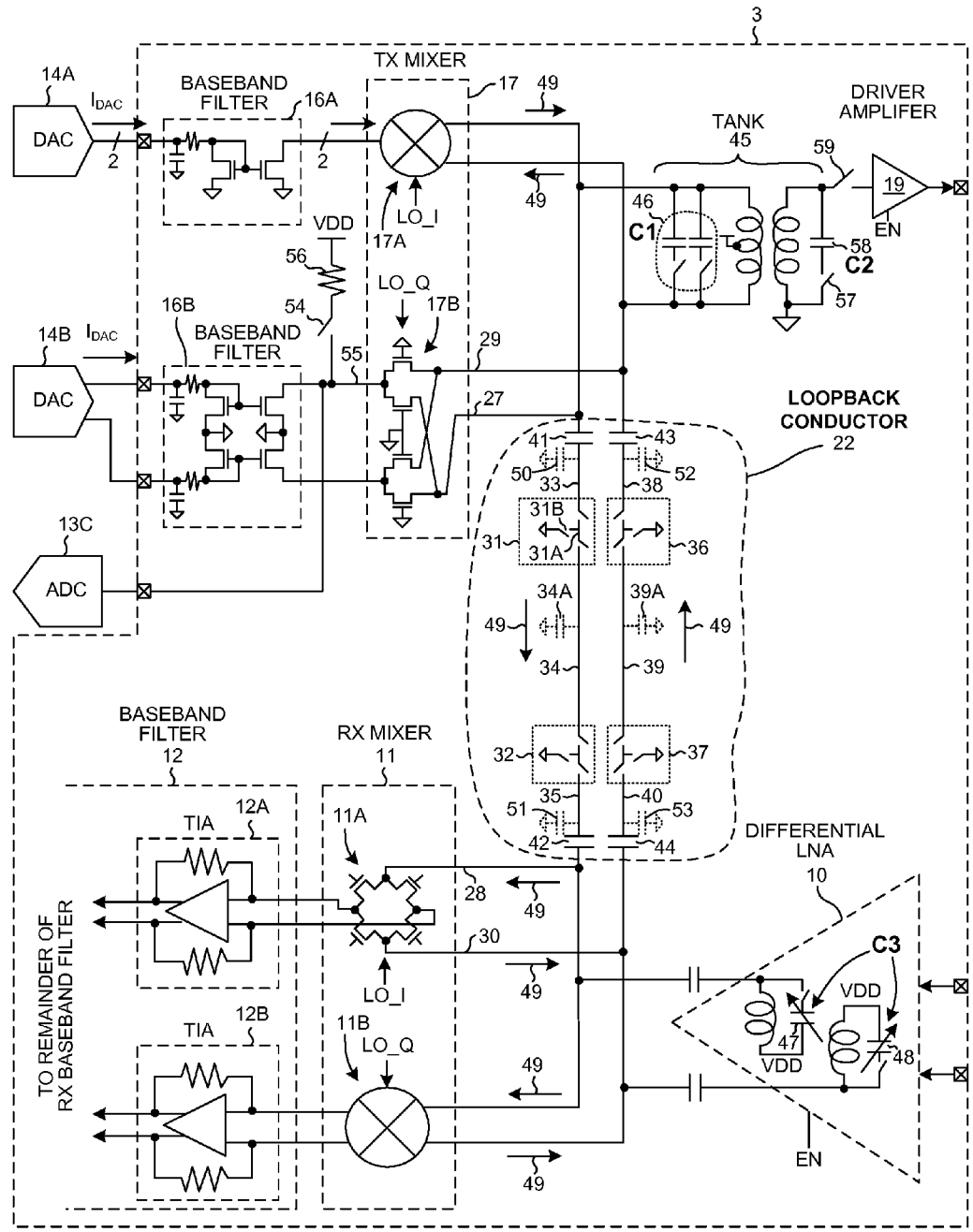
FIG. 3 is a more detailed diagram of the loopback conductor 22 of the RF transceiver integrated circuit 3 of FIG. 2.

FIG. 3 is a more detailed diagram of the loopback conductor 22 of the RF transceiver integrated circuit 3 of FIG. 2. The control conductors and control circuit 24 of the loopback conductor circuit 23 of FIG. 2 are not illustrated in FIG. 3 so that other detail of the circuit can be illustrated. Loopback conductor 22 includes a programmable mechanism for coupling node 27 to node 28 and for coupling node 29 to node 30. Loopback conductor 22 includes switch blocks 31, 32, 36 and 37, as well as conductor segments 33, 34, 35, 38, 39 and 40. Loopback conductor 22 also includes four DC blocking capacitors 41-44. Each DC blocking capacitor may, for example, have a capacitance of approximately 5 pF. In one advantageous aspect, conductor segments 34 and 39 are relatively long so that the transmit chain circuitry can be disposed at a considerable distance away from the receive chain circuitry. Laying out the RF transceiver integrated circuit 3 such that the transmit chain circuitry is located a considerable distance away from the receive chain helps reduce transmitter leakage and interference between the transmitter and receiver during normal operation. In the illustrated example, conductor segments 34 and 39 are each at least two millimeters in length.

There are at least two operating modes of RF transceiver integrated circuit 3: 1) a normal operating mode in which the transmit and receive chains are usable to engage in RF wireless communication; and 2) a loopback mode in which the transmit chain is used to drive signals to the receive chain to perform testing and/or calibration.

In the normal operating mode, the N-channel switches of switch block 31 and switch block 32 are controlled appropriately by control circuit 24 such that conductor segment 34 is isolated and disconnected from both conductor segment 33 and conductor segment 35. Central conductor 34 is allowed to float. Likewise, conductor segment 38 is isolated and disconnected from conductor segment 39 which in turn is isolated and disconnected from conductor segment 40. In each of the switch blocks 31, 32, 36 and 37, the central "T" node is grounded by closing an N-channel switch between the central "T" node and a ground conductor. In the example of switch block 31, switch 31B is closed to ground central "T" node 31A. The other two switches of switch block 31 are open. The grounding of central "T" node 31A prevents signal leakage through the switch block from conductor 33 to conductor 34.

In the normal operating mode, an I quadrature signal path extends through the I quadrature branch of the transmit chain 15. The I quadrature signal path extends through portion 16A of baseband filter 16, through portion 17A of mixer 17, through a tank circuit 45, through driver amplifier 19, out of RF transceiver integrated circuit 3 and to power amplifier 20 (see FIG. 2), and through duplexer 8 to antenna 2. The variable capacitor 46 (C1) on the primary of the tank 45 and capacitor 58 (C2) on the secondary of tank 45 are controlled to tune tank 45 so that power transmission from mixer 17 to driver amplifier 19 is maximized at the desired operating frequency. The I quadrature signal path in receive chain 5 extends from antenna 2 (see FIG. 2), through duplexer 8, through matching network 9, and into RF transceiver integrated circuit 3, through differential low noise amplifier 10, through portion 11A of mixer 11, through transimpedance amplifier (TIA) portion 12A of baseband filter 12, through the remainder of baseband filter 12, and to ADC 13 in baseband processor integrated circuit 4. Variable capacitors 47 and 48 (C3) of the differential LNA 10 are controlled to tune the LNA load of differential LNA 10 to maximize power transfer from LNA 10 into receive mixer 11. Switch blocks 32, 37 are located as close as possible to receive mixer 11 and to differential LNA 10, thereby minimizing capacitive loading on the conductors that couple the output of LNA 10 to the receive mixer 11. Similarly, switch blocks 31 and 36 are located as close as possible to transmit mixer 17 and tank 45, thereby minimizing capacitive loading on the conductors that couple the output of receiver mixer 17 to tank 45. The Q quadrature signal path through and out of the transmitter is similar to the above-described I quadrature transmit signal path, and the Q quadrature signal path into and through the receiver is similar to the above-described Q quadrature receive signal path.

In the loopback mode, the N-channel switches of switch block 31 and of switch block 32 are controlled by control circuit 24 such that conductor segment 33 is coupled to conductor segment 34 which in turn is coupled to conductor segment 35. Likewise, conductor segment 38 is coupled to conductor 39 which in turn is coupled to conductor segment 44.

In a first novel aspect, transmit mixer 17 of transmitter chain 15 of FIG. 3 is a current mode output mixer. Unlike the receive mixer set forth in the Bouras paper mentioned in the background information section of this patent document, the portions 11A and 11B of the receive mixer 11 of FIG. 3 are not active mixers but rather are passive mixers. Rather than each of the portions 11A and 11B having a high input impedance in the high hundreds of ohms at operating frequency in the Bouras paper, each of the portions 11A and 11B has a much lower input impedance at the operating frequency. In the example of FIG. 3, each of portions 11A and 11B has an input impedance of less than three hundred ohms (for example, in this example, the input impedance is approximately 150 ohms or less). Unlike the transmit mixer set forth in the Bouras paper, each of the portions 17A and 17B of transmit mixer 17 is a current mode output mixer. For example, the mixer portion 17A of the I quadrature branch of the transmit chain drives a current signal 49 through the loopback conductor 22 to passive I quadrature mixer branch 11A and to passive Q quadrature mixer branch 11B of the receive mixer 11. Due to the driving of current signal 49 and the terminating of the signal path in a low impedance in portions 11A and 11B, the two tone loopback signal can be driven a long distance of two or more millimeters from the transmit chain to the receive chain while still generating an adequately strong two tone signal in the two portions 11A and 11B of the receive mixer to perform an IP2 test. For a two tone signal output power of 2 dBm as output from transmit mixer 17, the two tone signal is received at receive mixer 11 at a power of −3 dBm.

In the loopback mode, the capacitance of variable capacitor 46 (C1) of the primary of tank circuit 45 is reduced to account for additional parasitic capacitance that is coupled onto the output of transmit mixer 17 when conductor segments 34 and 39 are coupled to the transmit mixer output leads. The switch 57 is in series with the capacitor 58 (C2) of the secondary of tank 45. Switch 57 is controlled to be open, and the switch 59 between the secondary and input lead of driver amplifier 19 is made to be open. Switch 59 prevents the input capacitance of driver amplifier 19 from loading the transmit mixer 17 during a loopback test. Driver amplifier 19 is also disabled to reduce current consumption during the loopback test and to prevent undesired strong transmissions from antenna 2 that might otherwise occur during loopback testing. In one example, the capacitance of variable capacitor 46 is set to 1.0 pF in the normal operating mode such that tank 45 resonates at a desired frequency of approximately 2.0 GHz, whereas the capacitance of variable capacitor 46 is set to approximately 0.5 pF in the loopback mode such that tank 45 resonates at the same desired frequency of approximately 2.0 GHz. In the illustration of FIG. 3, the added parasitic capacitances of loopback conductor 22 are represented by capacitor symbols 50, 51, 52, 53, 34A and 39A. Each of these parasitic capacitances may, for example, be approximately 0.5 pF. During the loopback mode, differential LNA 10 is disabled so it does not drive the receive chain mixer and interfere with current signal 49. Switches in series with LNA load capacitances 47 and 48 (C3) are controlled to maximize tank impedance in the loopback mode as well.

Figures 4, 5:
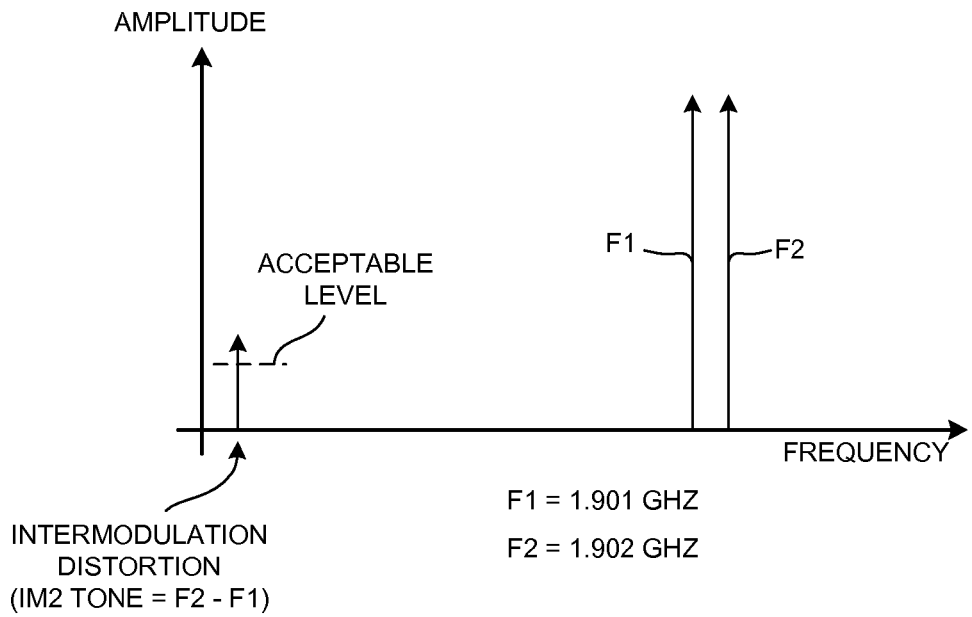
FIG. 4 is a simplified diagram that illustrates an IP2 test performed using the internal loopback conductor 22 of FIG. 2.
FIG. 5 is a table that sets forth various characteristics of the novel circuit of FIGS. 1-3 as compared to characteristics of the conventional WiFi loopback prior art set forth in the Bouras paper mentioned in the background section of this patent document.

In a second novel aspect, only one quadrature branch of the transmit mixer 17 is used to generate the two tones required for carrying out an IP2 test. FIG. 4 is a simplified diagram that illustrates an IP2 test. The two signals F1 and F2 are of identical power amplitudes. These two tones are driven into receive chain 5 via the loopback conductor 22. The magnitude of any resulting intermodulation distortion coming out of receive chain 5 is then measured. Various circuit parameters and settings of the transceiver may be changed, and the intermodulation distortion measured again, until the magnitude of the intermodulation distortion power falls below an acceptable level. To perform such an IP2 test using the novel loopback conductor 22, the I quadrature branch portion 14A of the differential current DAC 14 of FIG. 1 is made to drive a differential current signal to the portion 16A of the transmit chain. Although DAC 14 and portion 16A of the I branch are illustrated in simplified form, they are both differential circuits as illustrated more fully in the Q branch. Portion 16A includes an RC filter as well as a current mirror. The current mirror outputs a current signal to portion 17A of the transmit mixer 17 such that portion 17A outputs current signal 49 involving two tones. These two tones are communicated via loopback conductor 22 to the receive chain as explained above. The transistors of the other quadrature mixer branch (the Q quadrature mixer branch 17B in this example) are turned off and made nonconductive such that the outputs of the portion 16B of baseband filter 16 are isolated from loopback conductor 22. The ground symbols that are illustrated on the gates of the transistors of the Q quadrature mixer portion 17B in FIG. 3 represent how the transistors are turned off and controlled to be nonconductive. The use of one quadrature branch of the transmit mixer to output the two tones for an IP2 test has several advantages as compared to the use of two mixers to generate the two tones. First, the use of one mixer portion to generate both tones facilitates making both tones of the same amplitude. Second, the DAC 14 and baseband filter 16 need only drive one tone trajectory, resulting in more linear output as a function of current consumption. Third, the generation of the two tones does not rely on a mismatch between I and Q quadrature signal paths. Fourth, current consumption is reduced because only one signal path circuit is required as compared to two signal path circuits. This reduction in power consumption is especially advantageous in applications in which IP2 testing and calibration is to be performed in every slot.

In a third novel aspect, a first calibration test is performed using the I quadrature branch 16A, 17A of the transmit chain at the same time that a second calibration test is performed using the Q quadrature branch 16B, 17B of the transmit chain. Only one of the two quadrature branches of the transmit chain drives the loopback conductor 22 during this time. In one example, the I quadrature branch 16A, 17A of the transmit chain drives the two tone current signal 49 through loopback conductor 22 to the two portions 11A and 11B of receive mixer 11 in an IP2 calibration test. At the same time that this two tone current signal 49 is being driven across loopback conductor 22, a DC offset calibration test is performed in the Q quadrature branch 16B, 17B of the transmit chain. Control circuit 24 causes the transistors in portion 17B of mixer 17 to be nonconductive, thereby isolating the outputs of baseband filter portion 16B from loopback conductor 22. Control circuit 24 causes switch 54 to close such that node 55 is coupled to supply voltage VDD through resistor 56. DAC 14B of DAC 14 of FIG. 1 is a current mode output digital-to-analog converter (DAC) in that the magnitude of the current IDAC output by DAC 14B should correspond to a digital value received by DAC 14B. For a given digital value received, DAC 14B should drive the correct amount of current through the baseband filter portion 16B such that for a given load on node 55, the voltage on node 55 has a particular voltage. Accordingly, in a DC offset calibration test, the switch 54 is closed and DAC portion 14B is supplied with a digital value, and an analog-to-digital converter portion 13C of the ADC 13 of FIG. 1 reads the voltage on node 55. The offset current of DAC 14B is then adjusted such that when a particular digital value is supplied to DAC portion 14B the voltage on node 55 is measured to have the desired voltage.

In a cellular telephone, multiple calibration tests including an IP2 test and a DC offset calibration test may be performed periodically during normal operation of the cellular telephone, and/or initially upon power up of the cellular telephone. Allowing multiple ones of these calibration tests to be performed simultaneously as described above with respect to the IP2 test and the DC offset test allows the total amount of time required to carry out testing and calibration to be reduced. Reducing test and calibration time reduces the amount of power consumed to do testing and calibration and also decreases the wait time after a power up condition until the cellular telephone is usable to communicate in the normal operating mode.

FIG. 5 is a table that sets forth various characteristics of the novel circuit of FIGS. 1-3 as compared to characteristics of the conventional WiFi loopback prior art set forth in the Bouras paper mentioned in the background section of this patent document.

Figure 6:
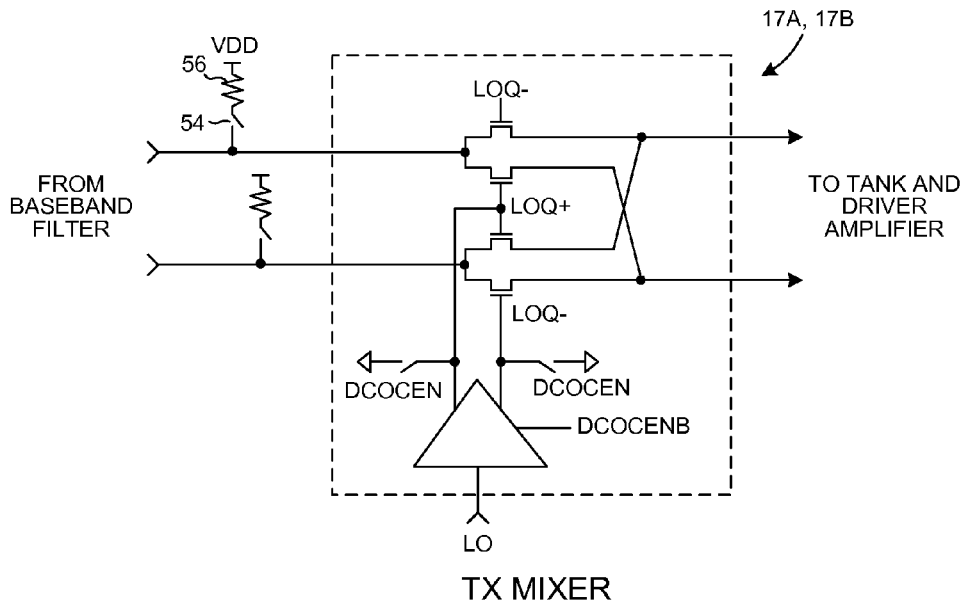
FIG. 6 is a more detailed diagram of one example of branch portion 17A or 17B of transmit mixer 17 of FIG. 3.

FIG. 6 is a more detailed diagram of one example of branch portion 17A or 17B of transmit mixer 17 of FIG. 3. DCOCEN identifies an active high DC offset calibration enable signal and DCOCENB identifies an active low DC offset calibration enable signal. DCOCEN and DCOCENB are received from control circuit 24 of the loopback conductor circuit 23 of FIG. 2.

Figure 7:
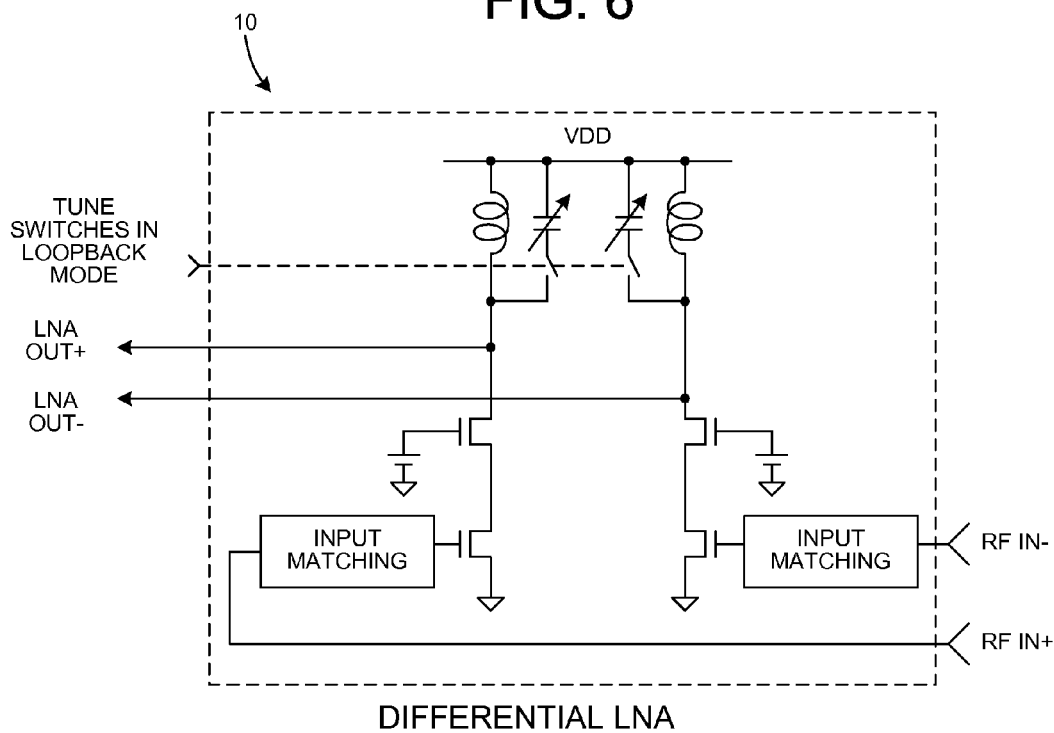
FIG. 7 is a more detailed diagram of one example of differential LNA 10 of FIG. 3.

FIG. 7 is a more detailed diagram of one example of differential LNA 10 of FIG. 3.

Figure 8:
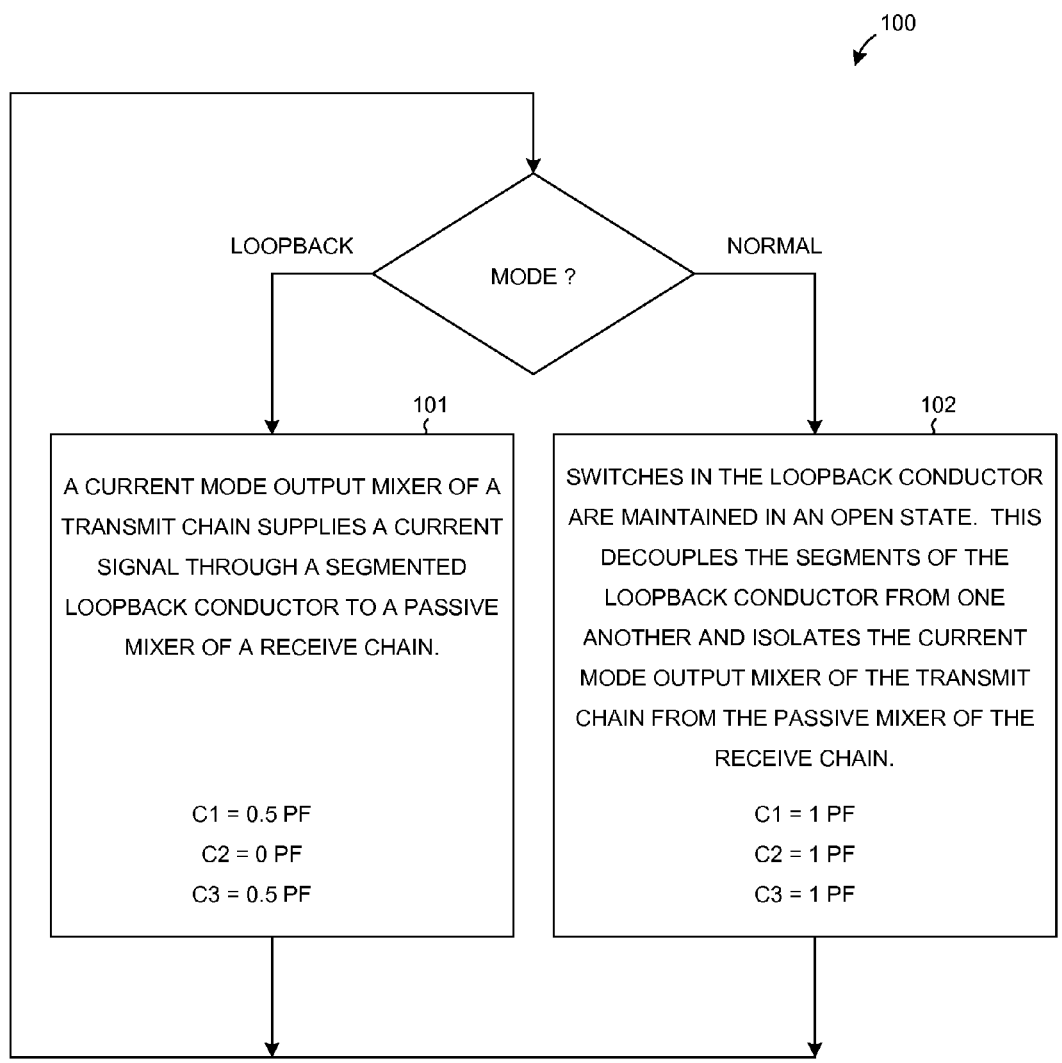
FIG. 8 is a flowchart of a method in accordance with one novel aspect.

FIG. 8 is a flowchart representation of a method 100 in accordance with one novel aspect. In one step (step 101), in a loopback mode of operation, a current signal is output by a current mode output mixer of a transmit chain. This current signal is supplied through a segmented loopback conductor to a passive mixer of a receive chain. The transmit chain, the loopback conductor, and the receive chain are all parts of the same integrated circuit. In one example, the current mode output mixer of this method is the current mode output mixer 17 of FIG. 3. In one example, the passive mixer of this method is the passive mixer 11 of FIG. 3. In one example, the segmented loopback conductor of this method is the segmented loopback conductor 22 of FIG. 3.

In another step (step 102), in a normal operating mode of the integrated circuit, switches in the segmented loopback conductor are maintained in an open state, thereby decoupling the segments of the loopback conductor from one another. The decoupling of segments of the loopback conductor serves to isolate the current mode output mixer of the transmit chain from the passive mixer of the receive chain. In one example, the segments of the loopback conductor of this method include segments 33, 34, 35, 38, 39 and 40 of FIG. 3. In one example, the switches that are opened and closed to couple and decouple the segments from one other are the switches of switch blocks 31, 32, 36 and 37. Steps 101 and 102 may be performed in any order, and may be repeated at periodic intervals during operation of the single integrated circuit within a cellular telephone.

Although certain specific embodiments are described above for instructional purposes, the teachings of this patent document have general applicability and are not limited to the specific embodiments described above. Although the switches of the switch blocks 31, 32, 36 and 37 are described above as being N-channel switches, these switches may in other examples be other types of switches such as P-channel switches or transfer gates. Accordingly, various modifications, adaptations, and combinations of the various features of the described specific embodiments can be practiced without departing from the scope of the claims that are set forth below.

What is claimed is:

1. An integrated circuit comprising:
   a receive chain that includes a passive mixer;
   a transmit chain that includes a current mode output mixer; and
   a loopback conductor operable in a loopback mode and in a normal operating mode, wherein in the loopback mode the loopback conductor supplies a current signal output by the current mode output mixer of the transmit chain to the passive mixer of the receive chain.

2. The integrated circuit of claim 1, wherein the loopback conductor comprises:
   a first conductor segment;
   a first switch block;
   a second conductor segment;
   a second switch block; and
   a third conductor segment, wherein in the loopback mode the current signal passes from the current mode output mixer of the transmit chain, through the first conductor segment, through the first switch block, through the second conductor segment, through the second switch block, through the third conductor segment, and to the passive mixer of the receive chain.

3. The integrated circuit of claim 2, wherein the first switch block comprises:
   a central T node;
   a first switch coupled between the first conductor segment and the central T node;
   a second switch coupled between the central T node and the second conductor segment; and
   a third switch coupled between the central T node and a ground conductor.

4. The integrated circuit of claim 2, wherein the loopback conductor further comprises:
   a fourth conductor segment;
   a third switch block;
   a fifth conductor segment;
   a fourth switch block; and
   a sixth conductor segment, wherein in the loopback mode a second current signal passes from the current mode output mixer of the transmit chain, through the fourth conductor segment, through the third switch block, through the fifth conductor segment, through the fourth switch block, through the sixth conductor segment, and to the passive mixer of the receive chain.

5. The integrated circuit of claim 2, wherein the loopback conductor further comprises:
   a first DC blocking capacitor coupled between the current mode output mixer and the first conductor segment; and
   a second DC blocking capacitor coupled between the third conductor segment and the passive mixer.

6. An integrated circuit comprising:
   a receive chain that includes a passive mixer;
   a transmit chain that includes a current mode output mixer; and
   a loopback conductor operable in a loopback mode and in a normal operating mode, wherein in the loopback mode the loopback conductor supplies a current signal output by the current mode output mixer of the transmit chain to the passive mixer of the receive chain, wherein the loopback conductor includes a conductor and a switch that is in series with the conductor, wherein in the normal operating mode the switch of the loopback conductor is open such that the current mode output mixer of the transmit chain is decoupled from the passive mixer of the receive chain, and wherein in the loopback mode the switch of the loopback conductor is closed such that the current signal is supplied to the passive mixer of the receive chain.

7. The integrated circuit of claim 6, wherein the passive mixer has an input impedance of less than three hundred ohms at an operating frequency of the current signal.

8. The integrated circuit of claim 6, wherein the transmit chain further includes a tunable tank circuit, and wherein the tank circuit is tuned such that the current mode output mixer to passive mixer gain in the loopback mode is substantially maximized.

9. The integrated circuit of claim 6, wherein the transmit chain further includes a tunable tank circuit, wherein the tank circuit is tuned to resonate with a first primary capacitance in the normal operating mode, and wherein the tank circuit is tuned to resonate with a second primary capacitance in the loopback mode.

10. The integrated circuit of claim 6, wherein the transmit chain further includes a driver amplifier and a driver amplifier switch, wherein the driver amplifier switch is disposed in a signal path between the current mode output mixer and an input lead of the driver amplifier, wherein the driver amplifier switch is open in the loopback mode, and wherein the driver amplifier switch is closed in the normal operating mode.

11. The integrated circuit of claim 6, wherein the switch of the loopback conductor is a switch block.

12. The integrated circuit of claim 6, wherein the loopback conductor is a switch block.

13. An integrated circuit comprising:
   a receive chain that includes a passive mixer;
   a transmit chain that includes a current mode output mixer; and
   a loopback conductor operable in a loopback mode and in a normal operating mode, wherein in the loopback mode the loopback conductor supplies a current signal output by the current mode output mixer of the transmit chain to the passive mixer of the receive chain, wherein the loopback conductor includes a first switch, a conductor, and a second switch, and wherein in the loopback mode the current signal output by the current mode output mixer flows in a current path from the current mode output mixer, through the first switch, through the conductor, through the second switch and to the passive mixer of the receive chain.

14. An integrated circuit comprising:
   a receive chain that includes a passive mixer;
   a transmit chain that includes a current mode output mixer;
   a loopback conductor operable in a loopback mode and in a normal operating mode, wherein in the loopback mode the loopback conductor supplies a current signal output by the current mode output mixer of the transmit chain to the passive mixer of the receive chain, and wherein during a period of operation in the loopback mode the current mode output mixer is enabled such that it drives the current signal onto the loopback conductor; and
   a second quadrature branch of the transmit chain that includes a second current mode output mixer, wherein during the period of operation in the loopback mode the second current mode output mixer is disabled such that it does not drive any signal onto the loopback conductor, and wherein during the normal operating mode the second current mode output mixer drives a second current signal onto the loopback conductor.

15. The integrated circuit of claim 14, wherein during the period of operation in the loopback mode a first calibration test is performed using the loopback conductor at a same time that a second calibration test is performed on a portion of the second quadrature branch of the transmit chain.

16. A method comprising:
 (a) in a loopback mode of operation of an integrated circuit supplying a current signal output by a current mode output mixer of a transmit chain through a loopback conductor to a passive mixer of a receive chain; and
 (b) opening a first switch in the loopback conductor such that in a normal operating mode of operation of the integrated circuit the current mode output mixer of the transmit chain is isolated from the passive mixer of the receive chain, wherein the transmit chain, the receive chain and the loopback conductor are parts of the integrated circuit.

17. The method of claim 16, further comprising:
 (c) tuning a capacitor of tank circuit to have first capacitance in the normal operating mode, wherein the tank circuit is coupled to the current mode output mixer; and
 (d) tuning the capacitor to have a second capacitance in the loopback mode.

18. The method of claim 16, further comprising:
 (c) tuning a tank circuit to maximize a current mode output mixer to passive mixer gain in the loopback mode, wherein the tank circuit is coupled to the current mode output mixer.

19. The method of claim 16, further comprising:
 (c) controlling a switch to be closed in the normal operating mode such that a signal path is maintained between the current mode output mixer and an input lead of a driver amplifier; and
 (d) controlling the switch to be open in the loopback mode such that the current mode output mixer is isolated from the input lead of the driver amplifier.

20. A method comprising:
 (a) in a loopback mode of operation of an integrated circuit supplying a current signal output by a current mode output mixer of a transmit chain through a loopback conductor to a passive mixer of a receive chain;
 (b) opening a first switch in the loopback conductor such that in a normal operating mode of operation of the integrated circuit the current mode output mixer of the transmit chain is isolated from the passive mixer of the receive chain, wherein the transmit chain, the receive chain and the loopback conductor are parts of the integrated circuit; and
 (c) opening a second switch in the loopback conductor at a same time that the first switch is opened in (b), wherein in (a) the current signal passes in a current path from the current mode output mixer through the first switch, through a conductor of the loopback conductor, and through the second switch and to the passive mixer.

21. A method comprising:
 (a) in a loopback mode of operation of an integrated circuit supplying a current signal output by a first current mode output mixer of a transmit chain through a loopback conductor to a passive mixer of a receive chain;
 (b) opening a first switch in the loopback conductor such that in a normal operating mode of operation of the integrated circuit the first current mode output mixer of the transmit chain is isolated from the passive mixer of the receive chain, wherein the transmit chain, the receive chain and the loopback conductor are parts of the integrated circuit;
 (c) maintaining the first current mode output mixer in an enabled state during a period of operation in the loopback mode such that the first current mode output mixer supplies the current signal onto the loopback conductor;
 (d) maintaining a second current mode output mixer of a second quadrature branch of the transmit chain in a disabled state during the period of operation in the loopback mode such that the second current mode output mixer does not drive any signal onto the loopback conductor, wherein the second quadrature branch of the transmit chain is also a part of the integrated circuit; and
 (e) in the normal operating mode maintaining the first and second current mode output mixers in an enabled state.

22. A method comprising:
 (a) in a loopback mode of operation of an integrated circuit supplying a current signal output by a current mode output mixer of a transmit chain through a loopback conductor to a passive mixer of a receive chain;
 (b) opening a first switch in the loopback conductor such that in a normal operating mode of operation of the integrated circuit the current mode output mixer of the transmit chain is isolated from the passive mixer of the receive chain, wherein the transmit chain, the receive chain and the loopback conductor are parts of the integrated circuit;
 (c) using the loopback conductor to perform a first calibration test in the loopback mode; and
 (d) using a second quadrature branch of the transmit chain to perform a second calibration test at a same time that the first calibration test is being performed in (c), wherein the second quadrature branch of the transmit chain is also a part of the integrated circuit.

23. An apparatus, comprising:
 a mixer of a receive chain;
 a current mode output mixer of a transmit chain; and
 means for driving a current signal through a signal path from the current mode output mixer of the transmit chain to the mixer of the receive chain in a loopback mode of operation of an integrated circuit, wherein the means and the receive chain and the transmit chain are parts of the integrated circuit, and wherein the means is also for breaking the signal path so that the current mode output mixer is isolated from the mixer of the receive chain in a normal operating mode of the integrated circuit.

24. The apparatus of claim 23, wherein the mixer of the receive chain is a passive mixer.

25. The apparatus of claim 24, wherein the passive mixer has an input impedance of less than three hundred ohms at an operating frequency of the current signal.

26. An apparatus, comprising:
 a mixer of a receive chain;
 a current mode output mixer of a transmit chain; and
 means for driving a current signal through a signal path from the current mode output mixer of the transmit chain to the mixer of the receive chain in a loopback mode of operation of an integrated circuit, wherein the means and the receive chain and the transmit chain are parts of the integrated circuit, wherein the means is also for breaking the signal path so that the current mode output mixer is isolated from the mixer of the receive chain in a normal operating mode of the integrated circuit, wherein the means includes a first switch, a conductor, and a second switch, wherein the first and second switches are closed in a period of operation in the loopback mode such that the signal path extends through the first switch, through the conductor, and through the second switch, and wherein the first and second switches are open in the normal operating mode.

* * * * *